(12) United States Patent
Luo

(10) Patent No.: US 11,217,698 B2
(45) Date of Patent: Jan. 4, 2022

(54) METHOD OF MANUFACTURING A THIN FILM TRANSISTOR

(71) Applicant: SHENZHEN CHINA STAR OPTOELECTRONICS SEMICONDUCTOR DISPLAY TECHNOLOGY CO., LTD., Guangdong (CN)

(72) Inventor: Chuanbao Luo, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 16/770,827

(22) PCT Filed: Jun. 5, 2020

(86) PCT No.: PCT/CN2020/094656
§ 371 (c)(1),
(2) Date: Jun. 8, 2020

(65) Prior Publication Data
US 2021/0376160 A1     Dec. 2, 2021

(30) Foreign Application Priority Data
May 26, 2020   (CN) .......................... 202010454684.8

(51) Int. Cl.
*H01L 27/00*     (2006.01)
*H01L 29/00*     (2006.01)
(Continued)

(52) U.S. Cl.
CPC ...... *H01L 29/78684* (2013.01); *G02F 1/1368* (2013.01); *G02F 1/136209* (2013.01);
(Continued)

(58) Field of Classification Search
CPC ............. H01L 27/1225; H01L 27/1248; H01L 27/1259; H01L 27/3272; H01L 29/78684;
(Continued)

(56) References Cited

U.S. PATENT DOCUMENTS 7,411,638 B2 *  8/2008  Kim .................... G02F 1/13454
                                                      257/E27.111
8,513,720 B2 *  8/2013  Herman ............ H01L 21/02565
                                                      257/289

(Continued)

FOREIGN PATENT DOCUMENTS

CN     101630692 A     1/2010
CN     103165676 A     6/2013
(Continued)

*Primary Examiner* — Nikolay K Yushin
(74) *Attorney, Agent, or Firm* — The Roy Gross Law Firm, LLC; Roy Gross

(57) ABSTRACT

A thin film transistor is provided. The thin film transistor includes an active layer, and the active layer includes a plurality of stacked structures, and each of the stacked structures includes: a N-layer indium oxidation layer; a gallium oxidation layer, the gallium oxidation layer is provided on the indium oxidation layer of the N-layer indium oxidation layer; and a zinc oxidation layer is provided on the gallium oxidation layer. These stacked structures improve the performance of the thin film transistor. A preparation method of the thin film transistor and a display panel containing the thin film transistor is also provided.

5 Claims, 6 Drawing Sheets

(51) Int. Cl.
*H01L 29/786* (2006.01)
*H01L 27/32* (2006.01)
*G02F 1/1368* (2006.01)
*G02F 1/1362* (2006.01)
*H01L 27/12* (2006.01)

(52) U.S. Cl.
CPC ...... *H01L 27/1225* (2013.01); *H01L 27/1248* (2013.01); *H01L 27/1259* (2013.01); *H01L 27/3272* (2013.01); *H01L 29/7869* (2013.01); *H01L 29/78633* (2013.01)

(58) Field of Classification Search
CPC ........... H01L 29/78633; H01L 29/7869; G02F 1/136209; G02F 1/1368; G02F 1/136286; G02F 1/133305; G02F 1/1362
See application file for complete search history.

(56) References Cited

U.S. PATENT DOCUMENTS

| | | | | |
|---|---|---|---|---|
| 9,130,042 B2 * | 9/2015 | Lee | ...................... | H01L 29/7869 |
| 9,502,604 B2 * | 11/2016 | Kwon | .................. | H01L 27/3258 |
| 9,634,029 B2 * | 4/2017 | Chuang | ............... | H01L 51/0545 |
| 9,799,717 B2 * | 10/2017 | Jung | .................... | H01L 51/5203 |
| 2005/0140909 A1 * | 6/2005 | Kim | ....................... | H01L 27/124 |
| | | | | 349/151 |
| 2010/0006834 A1 | 1/2010 | Kim | | |
| 2012/0012835 A1 * | 1/2012 | Herman | ............ | H01L 21/02581 |
| | | | | 257/43 |
| 2013/0146868 A1 | 6/2013 | Zan et al. | | |
| 2014/0209894 A1 * | 7/2014 | Lee | ................... | H01L 29/78633 |
| | | | | 257/43 |
| 2015/0279862 A1 * | 10/2015 | Chuang | ............... | H01L 27/1218 |
| | | | | 257/40 |
| 2015/0357393 A1 * | 12/2015 | Kwon | ................. | H01L 29/7869 |
| | | | | 257/40 |
| 2017/0062542 A1 * | 3/2017 | Jung | .................... | H01L 51/5203 |
| 2019/0153595 A1 * | 5/2019 | Wang | ................. | C23C 16/45544 |
| 2019/0172954 A1 | 6/2019 | Zhou et al. | | |

FOREIGN PATENT DOCUMENTS

| | | |
|---|---|---|
| CN | 107799570 A | 3/2018 |
| CN | 110416314 A | 11/2019 |

* cited by examiner

METHOD OF MANUFACTURING A THIN FILM TRANSISTOR

FIELD OF INVENTION

The present disclosure relates to the field of display technology, and more particularly, to a thin film transistor and manufacturing method thereof, and a display panel.

BACKGROUND OF INVENTION

Recently, metal oxide thin film transistors (TFTs) have been widely used in active matrix liquid crystal display (AMLCD) devices and active-matrix organic light-emitting diode (AMOLED) display devices. AMLCD devices and AMOLED display devices that have adopted metal oxide TFTs have significant advantages such as high resolution, large size, high refresh frequency, and high transmittance across the spectrum of visible light, which have wide application prospects in the field of display.

Indium gallium zinc oxide (IGZO) TFTs are a representative oxide TFT, which has a variety of typical structures. Among them, top-gate IGZO TFTs have been widely used because of advantages such as a small parasitic capacitance, lower mask usage during a manufacturing process, and that a gate and a gate insulating layer can protect a channel region from being affecting by an atmospheric environment and subsequent plasma during the manufacturing processes. However, current top-gate IGZO TFTs cannot balance both high mobility and high uniformity, resulting in poor performance of the current top-gate IGZO TFTs and display panels that use them.

SUMMARY OF INVENTION

The present disclosure provides a thin film transistor and a manufacturing method thereof, and a display panel, to solve the technical problem of poor performance of the currently top-gate IGZO TFT and the display panel including the same.

In a first aspect, the present disclosure provides a thin film transistor, the thin film transistor includes an active layer, wherein the active layer comprises a plurality of stacked structures, and each of the stacked structures includes:

a N-layer indium oxidation layer, wherein N is an integer greater than 1;
a gallium oxidation layer disposed on the N-layer indium oxidation layer; and
a zinc oxidation layer disposed on the gallium oxidation layer.

In some embodiments, the thin film transistor further includes:

a substrate
a light-shielding layer disposed on the substrate; and
a buffer layer disposed on the substrate and covering the light-shielding layer;
wherein the active layer is disposed on the buffer layer by an atomic layer deposition method.

In some embodiments, the thin film transistor further includes:

a gate insulating layer disposed on the active layer;
a gate layer disposed on the gate insulating layer;
an interlayer dielectric layer disposed on the buffer layer and covering the gate layer, the gate insulating layer, and the active layer;

a source-drain layer disposed on the interlayer dielectric layer, and the source-drain layer comprises a plurality of source electrodes and a plurality of drain electrodes arranged at intervals;
a passivation layer disposed on the interlayer dielectric layer and covering source-drain layer; and
a pixel electrode layer disposed on the passivation layer.

In some embodiments, the thin film transistor further includes:

a first via hole formed on the interlayer dielectric layer and the buffer layer for electrically connecting the source electrode and the light-shielding layer;
a second via hole formed on the interlayer dielectric layer for electrically connecting the source electrode and the active layer;
a third via hole formed on the interlayer dielectric layer for electrically connecting the drain electrode and the active layer; and
a fourth via hole formed on the passivation layer and configured to electrically connect the drain electrode and the pixel electrode layer.

In some embodiments, the substrate is a glass substrate, and the light-shielding layer is made of metal.

In some embodiments, the buffer layer is a silicon oxide film, a silicon nitride film, or a composite film formed by alternately stacking silicon oxide films and silicon nitride films.

In a second aspect, the present disclosure provides a method of manufacturing a thin film transistor, which includes the following steps:

step S1, manufacturing an active layer; wherein the active layer comprises a plurality of stacked structures, and each of the stacked structures comprises:
a N-layer indium oxidation layer, wherein N is an integer greater than 1;
a gallium oxidation layer disposed on the N-layer indium oxidation layer; and
a zinc oxidation layer disposed on the gallium oxidation layer.

In some embodiments, before the step S1, the method of manufacturing the thin film transistor further includes the following steps:

step S01, manufacturing a substrate;
step S02, manufacturing a light-shielding layer on the substrate; and
step S03, manufacturing a buffer layer on the substrate, and the buffer layer covering the light-shielding layer;
wherein the step S1 is specifically manufacturing the active layer on the buffer layer by an atomic layer deposition method In some embodiments, the step manufacturing the active layer on the buffer layer by the atomic layer deposition method further includes the following steps:

step S11, using the buffer layer as a current layer;
step S12, using the atomic layer deposition method, sequentially depositing a N-layer indium oxidation layer on the current layer, depositing the gallium oxidation layer on the N-layer indium oxidation layer, and depositing the zinc oxidation layer on the gallium oxidation layer to form the stacked structure;
step S13, using the zinc oxidation layer on the currently formed stacked structure as the current layer, and repeatedly performing the step S12 until several stacked structures are formed; and
step S14, patterning a plurality of the stacked structures to obtain the active layer.

In some embodiments, after the step S1 further includes the following steps:
- s21, manufacturing a gate insulating layer on the active layer;
- s22, manufacturing a gate layer on the gate insulating layer;
- s23, manufacturing an interlayer dielectric layer on the buffer layer and covering the gate layer, the gate insulating layer, and the active layer;
- s24, manufacturing a source-drain layer on the interlayer dielectric layer, and the source-drain layer comprises a plurality of source electrodes and a plurality of drain electrodes arranged at intervals;
- s25, manufacturing a passivation layer on the interlayer dielectric layer and covering source-drain layer; and
- s26, manufacturing a pixel electrode layer on the passivation layer.

In some embodiments, the method of manufacturing the thin film transistor further includes the following steps:
- manufacturing a first via hole on the interlayer dielectric layer and the buffer layer for electrically connecting the source electrode and the light-shielding layer;
- manufacturing a second via hole on the interlayer dielectric layer for electrically connecting the source electrode and the active layer;
- manufacturing a third via hole on the interlayer dielectric layer for electrically connecting the drain electrode and the active layer; and
- manufacturing a fourth via hole on the passivation layer and configured to electrically connect the drain electrode and the pixel electrode layer.

In some embodiments, thicknesses of the indium oxidation layer, the gallium oxidation layer, and the zinc oxidation layer ranges from 50 A to 300 A.

In some embodiments, deposition rates of the indium oxidation layer, the gallium oxidation layer, and the zinc oxidation layer ranges from 0.8 A/cycle to 2.2 A/cycle.

In some embodiments, the deposition rates of the zinc oxidation layer, the gallium oxidation layer and the indium oxidation layer are sequentially reduced.

In a third aspect, the present disclosure provides a display panel including a thin film transistor comprising an active layer, the active layer comprises a plurality of stacked structures, and each of the stacked structures includes
- a N-layer indium oxidation layer, wherein N is an integer greater than 1;
- a gallium oxidation layer disposed on the N-layer indium oxidation layer; and
- a zinc oxidation layer disposed on the gallium oxidation layer.

In some embodiments, the thin film transistor further includes:
- a substrate
- a light-shielding layer disposed on the substrate; and
- a buffer layer disposed on the substrate and covering the light-shielding layer;
- wherein the active layer is disposed on the buffer layer by an atomic layer deposition method.

In some embodiments, the thin film transistor further includes:
- a gate insulating layer disposed on the active layer;
- a gate layer disposed on the gate insulating layer;
- an interlayer dielectric layer disposed on the buffer layer and covering the gate layer, the gate insulating layer, and the active layer;
- a source-drain layer disposed on the interlayer dielectric layer, and the source-drain layer comprises a plurality of source electrodes and a plurality of drain electrodes arranged at intervals;
- a passivation layer disposed on the interlayer dielectric layer and covering source-drain layer; and
- a pixel electrode layer disposed on the passivation layer.

In some embodiments, the thin film transistor further includes:
- a first via hole formed on the interlayer dielectric layer and the buffer layer for electrically connecting the source electrode and the light-shielding layer;
- a second via hole formed on the interlayer dielectric layer for electrically connecting the source electrode and the active layer;
- a third via hole formed on the interlayer dielectric layer for electrically connecting the drain electrode and the active layer; and
- a fourth via hole formed on the passivation layer and configured to electrically connect the drain electrode and the pixel electrode layer.

In some embodiments, the substrate is a glass substrate, and the light-shielding layer is made of metal.

In some embodiments, the buffer layer is a silicon oxide film, a silicon nitride film, or a composite film formed by alternately stacking silicon oxide films and silicon nitride films.

The present disclosure can effectively increase an electron concentration in the active layer and improve a mobility of the thin film transistor by setting number of the indium oxidation layers in a stacked structure of the active layer in the thin film transistor to at least two. At the same time, the active layer adopts the stacked structure of a N-layer indium oxidation layer, a gallium oxidation layer, and a zinc oxidation layer. Since a uniformity of the above-mentioned film layers is great, the uniformity of the active layer can be improved overall. Since the mobility of the thin film transistor and the uniformity of the active layer are improved, the performance of the thin film transistor can be greatly improved.

DETAILED DESCRIPTION OF PREFERRED EMBODIMENTS

To make the objectives, technical solutions, and effects of the present disclosure clearer and more specific, the present disclosure will be described in further detail below with reference to the accompanying figures and embodiments. It should be understood that the specific embodiments described herein are only used to explain the present disclosure and are not intended to limit the present disclosure.

Figure 1:
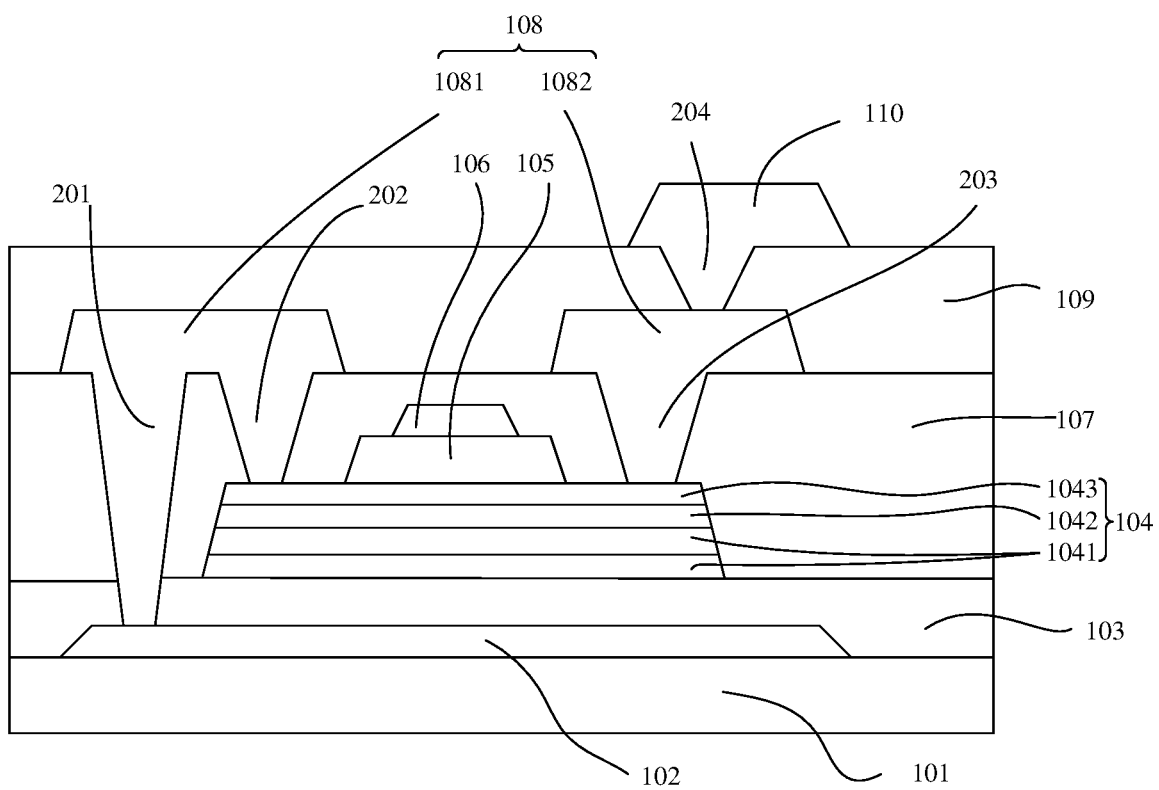
FIG. 1 is a schematic diagram of a thin film transistor of one embodiment of the present disclosure.

As shown in FIG. 1, one embodiment of the present disclosure provides a thin film transistor. The thin film transistor includes an active layer 104. The active layer 104 includes a plurality of stacked structures, and each of the stacked structures includes: an N-layer indium oxidation (InOx) layer 1041, a gallium oxidation (GaOx) layer 1042, and a zinc oxidation (ZnOx) layer 1043, where N is an integer greater than 1. The gallium oxidation layer 1042 is disposed on the N-layer indium oxidation layer 1041. The zinc oxidation layer 1043 is disposed on the gallium oxidation layer 1042.

Specifically, the active layer 104 in FIG. 1 includes a stacked structure including two indium oxidation layers 1041, and the two indium oxidation layers 1041 are called a first indium oxidation layer 1041 and a second indium oxidation layer 1041 in order from bottom to top. At this time, the gallium oxidation layer 1042 is disposed on the second indium oxidation layer 1041.

The active layer 104 may further include a plurality of stacked structures, for example, the active layer 104 includes two stacked structures, and the two stacked structures are called a first stacked structure and a second stacked structure in order from bottom to top. At this time, the first indium oxidation layer 1041 of the second stacked structure is disposed on the zinc oxidation layer 1043 of the first stacked structure.

It should be noted that, since the number of indium oxidation layers 1041 is at least two, therefore one can effectively increase an electron concentration inside the active layer 104, and improve a mobility of the thin film transistor. At the same time, the active layer 104 adopts a stacked design of the N-layer indium oxidation layer 1041, the gallium oxidation layer 1042, and the zinc oxidation layer 1043. Due to the high uniformity of the above-mentioned layers, the overall uniformity of the active layer 104 can be improved. It can be understood that, since the mobility of the thin film transistor and the uniformity of the active layer 104 are improved, the performance of the thin film transistor can thus be greatly improved.

Based on the above embodiment, as shown in FIG. 1, the thin film transistor further includes: a substrate 101, a light-shielding layer 102, and a buffer layer 103. The substrate 101 is preferably a glass substrate. The light-shielding layer 102 is disposed on the substrate 101. The buffer layer 103 is disposed on the substrate 101 and covering the light-shielding layer 102. The active layer 104 is disposed on the buffer layer 103 by using an atomic layer deposition method. The substrate 101 is preferably a glass substrate, the light-shielding layer 102 is made of metal. The buffer layer is a silicon oxide film, a silicon nitride film, or a composite film formed by alternately stacking silicon oxide films and silicon nitride films.

It should be noted that manufacturing the active layer 104 on the buffer layer 103 by the atomic layer deposition method can improve the oxygen content and oxygen vacancy defects in each of the film layers of the active layer 104, and reduce shallow defects in each of the film layers, thereby decreasing an interface state density of the active layer 104 and further improving the uniformity of the active layer 104.

Based on any of the above embodiments, as shown in FIG. 1, the thin film transistor further includes: a gate insulating layer 105, a gate layer 106, an interlayer dielectric layer 107, a source/drain layer 108, a passivation layer 109, and a pixel electrode layer 110. The gate insulating layer 105 is disposed on the active layer 104 and the gate layer 106 is disposed on the gate insulating layer 105. The interlayer dielectric layer 107 is disposed on the buffer layer 103 and covering the gate layer 106, the gate insulation layer 105, and the active layer 104. The source-drain layer 108 is disposed on the interlayer dielectric layer 107, and the source-drain layer 108 includes a plurality of source electrodes 1081 and a plurality of drain electrodes 1082 arranged at intervals. The passivation layer 109 disposed on the interlayer dielectric layer 107 and covering the source-drain layer 108. The pixel electrode layer 110 is disposed on the passivation layer 109.

Based on any of the above embodiments, as shown in FIG. 1, the thin film transistor further includes: a first via hole 201, a second via hole 202, a third via hole 203, and a fourth via hole 204. The first via hole 201 is formed on the interlayer dielectric layer 107 and the buffer layer 103 is configured to electrically connect the source electrode 1081 and the light-shielding layer 102. The second via hole 202 is formed on the interlayer dielectric layer 107 and is configured to electrically connect the source electrode 1081 and the active layer 104. The third via hole 203 is formed on the interlayer dielectric layer 107 and is configured to electrically connect the drain electrode 1082 and the active layer 104. The fourth via hole 204 is formed on the passivation layer 109 and configured to electrically connect the drain electrode 1082 and the pixel electrode layer 110.

In addition, it should be noted that the structure of the active layer 104 provided by the embodiments of the present disclosure is not only applicable to top-gate TFTs, but also applicable to bottom-gate TFTs and etch-blocking TFTs.

Figure 2:
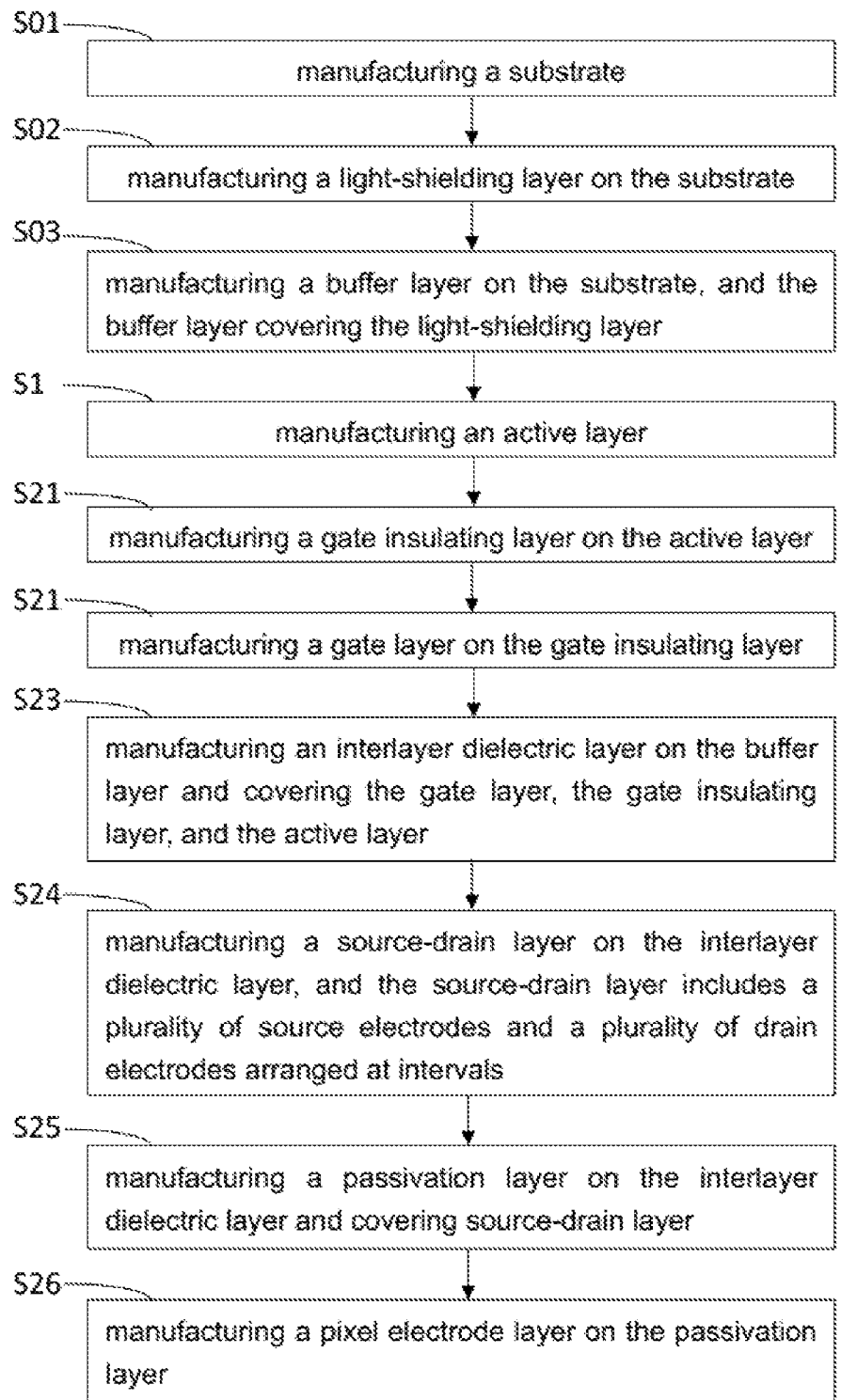
FIG. 2 is a flowchart of a method of manufacturing a thin film transistor of one embodiment of the present disclosure.

Embodiments of the present disclosure also provide a method of manufacturing the above thin film transistor. As shown in FIG. 2, the method of manufacturing the thin film transistor includes the following steps:

Step S1, manufacturing the active layer 104. The active layer 104 includes a plurality of stacked structures, and each of the stacked structures includes a N-layer indium oxidation layer 1041, a gallium oxidation layer 1042, and a zinc oxidation layer 1043. N is an integer greater than 1. The gallium oxidation layer 1042 is disposed on the N-layer indium oxidation layer 1041. The zinc oxidation layer 1043 is disposed on the gallium oxidation layer 1042.

The structure of the active layer 104 has been described in detail in the above embodiments, and will not be repeated here.

It should be noted that, manufacturing at least two layers structure of the indium oxidation layers 1041, therefore can effectively increasing an electron concentration inside the active layer 104, and improving a mobility of the thin film transistor. At the same time, the active layer 104 adopts a stacked design of the N-layer indium oxidation layer 1041, the gallium oxidation layer 1042, and the zinc oxidation layer 1043. Due to the high uniformity of the above-mentioned layers, the overall uniformity of the active layer 104 can be improved. It can be understood that, since the mobility of the thin film transistor and the uniformity of the active layer 104 are improved, the performance of the thin film transistor can be greatly improved.

Based on any of the above embodiments, as shown in FIG. 2, before step S1, the method of manufacturing the thin film transistor further includes the following steps:

Step S01, manufacturing a substrate 101, wherein the substrate 101 is preferably a glass substrate.

Step S02, manufacturing a light-shielding layer 102 on the substrate 101.

Step S03, manufacturing a buffer layer 103 on the substrate 101, and the buffer layer 103 covering the light-shielding layer 102.

Specifically, Step S1 is manufacturing the active layer 104 on the buffer layer 103 by using an atomic layer deposition method.

Figure 3:
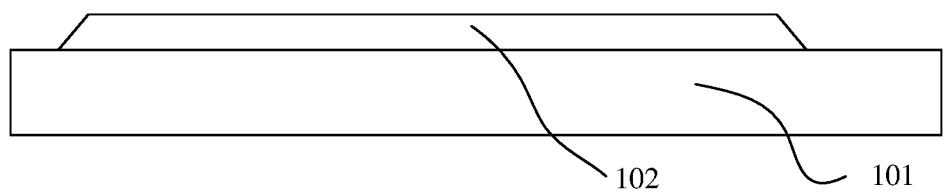
FIG. 3 is a schematic diagram of manufacturing a light-shielding layer of one embodiment of the present disclosure.

Specifically, as shown in FIG. 3, a substrate 101 is provided, a metal is deposited on the substrate 101 by using a physical vapor sputtering method, the metal is etched by using a photolithography process to obtain the light-shielding layer 102, wherein the material of the metal may be molybdenum (Mo), copper (Cu), or an alloy material composed of molybdenum and copper, and a hydrogen peroxide ($H_2O_2$) chemical solution may be used as an etchant in the photolithography process.

Figure 4:
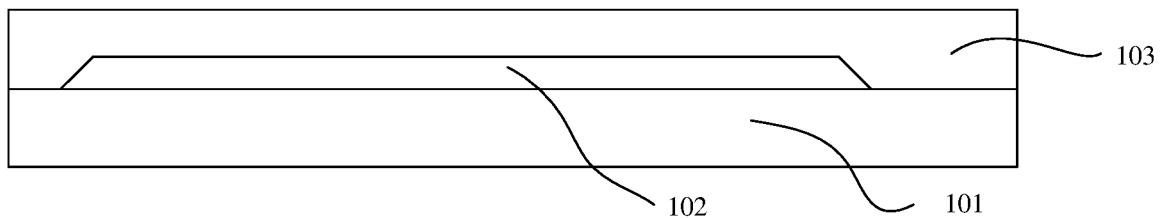
FIG. 4 is a schematic diagram of manufacturing a buffer layer of one embodiment of the present disclosure.

As shown in FIG. 4, after manufacturing the light-shielding layer 102 is completed, the buffer layer 103 is deposited on the substrate 101 by using a chemical vapor method and performing high-temperature thermal annealing to complete the manufacture of the buffer layer 103. The material of the buffer layer 103 is a silicon oxide (SiOx) film, a silicon nitride (SiNx) film, or a composite film formed by alternately stacking silicon oxide films and silicon nitride films.

After manufacturing the buffer layer 103, the active layer 104 is manufactured on the buffer layer 103 by using an atomic layer deposition method.

It should be noted that manufacturing the active layer 104 on the buffer layer 103 by using the atomic layer deposition method can improve the oxygen content and oxygen vacancy defects in each of the film layers of the active layer 104, and reduce shallow defects in each of the film layers, thereby decreasing an interface state density of the active layer 104 and further improving the uniformity of the active layer 104.

Figure 5:
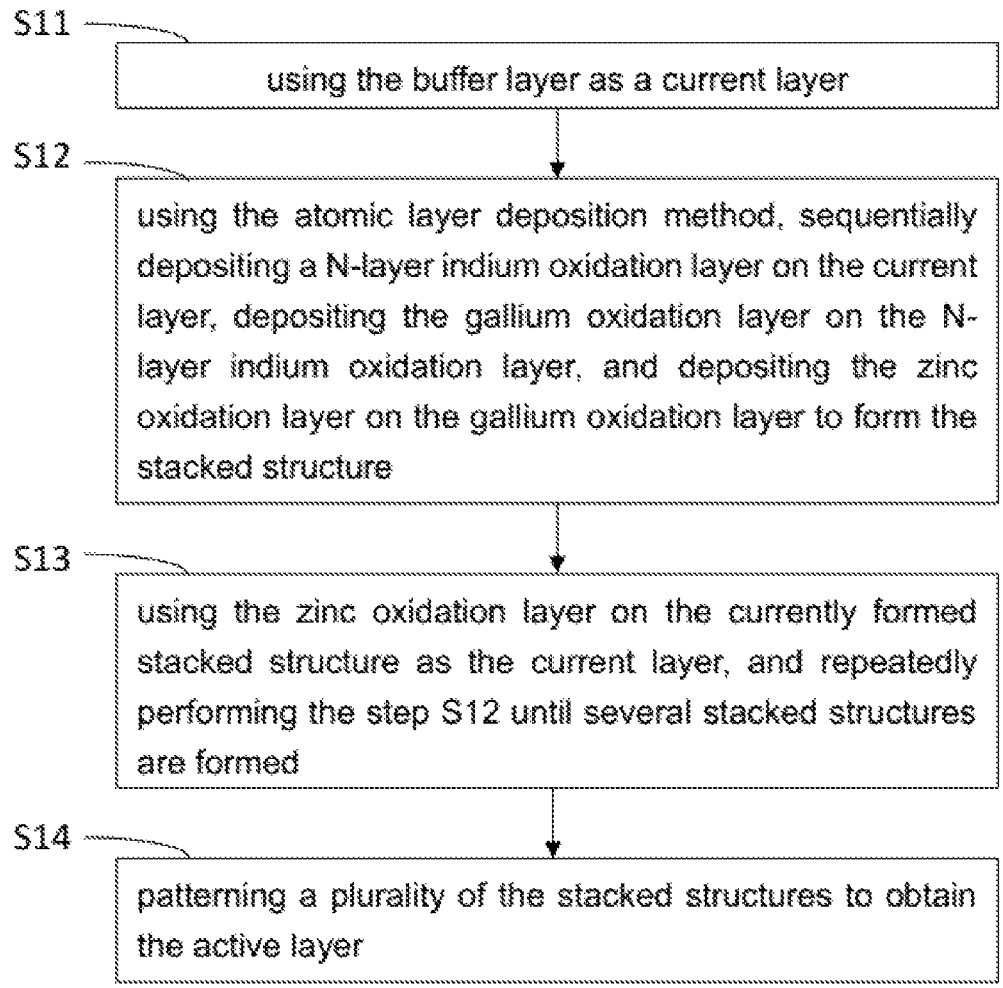
FIG. 5 is a flowchart of a method of manufacturing an active layer of one embodiment of the present disclosure.

Based on any of the above embodiments, as shown in FIG. 5, the step of manufacturing the active layer 104 on the buffer layer 103 by using the atomic layer deposition method includes the following steps:

step S11, using the buffer layer 103 as a current layer.

step S12, using the atomic layer deposition method, sequentially depositing the N-layer indium oxidation layer 1041 on the current layer, depositing the gallium oxidation layer 1042 on the N-layer indium oxidation layer 1041, and depositing the zinc oxidation layer 1043 on the gallium oxidation layer 1042 to form the stacked structure.

step S13, using the zinc oxidation layer 1043 on the currently formed stacked structure as the current layer, and repeatedly performing the step S12 until several stacked structures are formed.

Step S14, patterning a plurality of the stacked structures to obtain the active layer 104.

Specifically, manufacturing the active layer 104 on the buffer layer 103 by using the atomic layer deposition method, wherein a precursor used when depositing the indium oxidation layer 1041 on the buffer layer 103 by using the atomic layer deposition method is an indium source, and the indium source is specifically (3-dimethylaminopropyl)-dimethyl indium. A precursor used when depositing the gallium oxidation layer 1042 on the N-layer indium oxidation layer 1041 by using the atomic layer deposition method is a gallium source, and the gallium source is specifically trimethylgallium. A precursor used when depositing the zinc oxidation layer 1043 on the gallium oxidation layer 1043 by using the atomic layer deposition method is a zinc source, and the zinc source is specifically diethylzinc.

Figure 6:
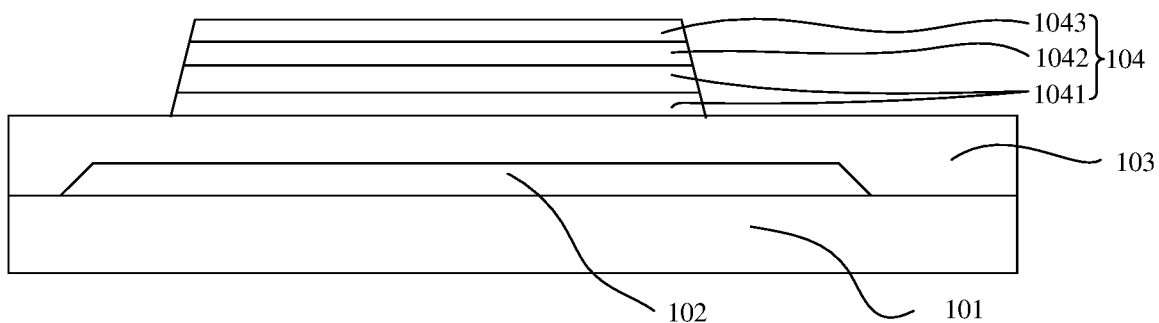
FIG. 6 is a schematic diagram of manufacturing an active layer of one embodiment of the present disclosure.

As shown in FIG. 6, the deposited N-layer indium oxidation layer 1041, gallium oxidation layer 1042, and zinc oxidation layer 1043 are called a stacked structure. If the active layer 104 only includes one stacked structure, then the stacked structure is patterned and becomes the active layer 104; otherwise, continue performing step S12 on the currently formed zinc oxidation layer 1043 until a plurality of stacked structures is obtained, and then the plurality of stacked layers are patterned to obtain the active layer 104, wherein a photolithography process is used to pattern the formed the plurality of stacked structures, and an oxalic acid-based chemical solution can be used as an etchant in the photolithography process.

It should be noted that the thickness of each film layer in the active layer 104 ranges from 50 A to 300 A, a deposition rate of each film layer is controlled, ranging from 0.8 A/cycle to 2.2 A/cycle, and the deposition rates of the zinc oxidation layer 1043, the gallium oxidation layer 1042 and the indium oxidation layer 1041 are sequentially reduced.

Based on any of the above embodiments, as shown in FIG. 2, after step S1, the method of manufacturing the thin film transistor further includes the following steps:

s21, manufacturing a gate insulating layer 105 on the active layer 104.

s22, manufacturing a gate layer 106 on the gate insulating layer 105.

s23, manufacturing an interlayer dielectric layer 107 on the buffer layer 103 and covering the gate layer 106, the gate insulating layer 105, and the active layer 104.

s24, manufacturing a source-drain layer 108 on the interlayer dielectric layer 107, and the source-drain layer 108 includes a plurality of source electrodes 1081 and a plurality of drain electrodes 1082 arranged at intervals.

s25, manufacturing a passivation layer 109 on the interlayer dielectric layer 107 and covering source-drain layer 108.

s26, manufacturing a pixel electrode layer 110 on the passivation layer 109.

Figure 7:
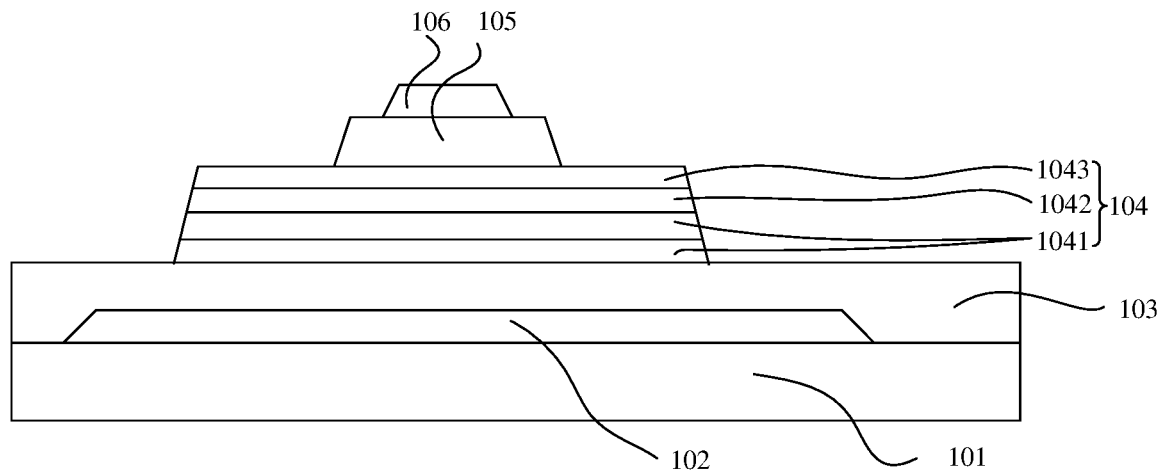
FIG. 7 is a schematic diagram of manufacturing a gate insulating layer and a gate layer of one embodiment of the present disclosure.

Specifically, as shown in FIG. 7, an insulating material is deposited on the active layer 104 by using a chemical vapor method, a metal is deposited on the insulating material, the insulating material and the metal are etched by using the photolithography process to obtain the gate insulating layer 105 and the gate 106, respectively, wherein the material of the metal may be molybdenum (Mo), copper (Cu), or an alloy material composed of molybdenum and copper, and a hydrogen peroxide ($H_2O_2$) chemical solution may be used as an etchant in the photolithography process.

Figure 8:
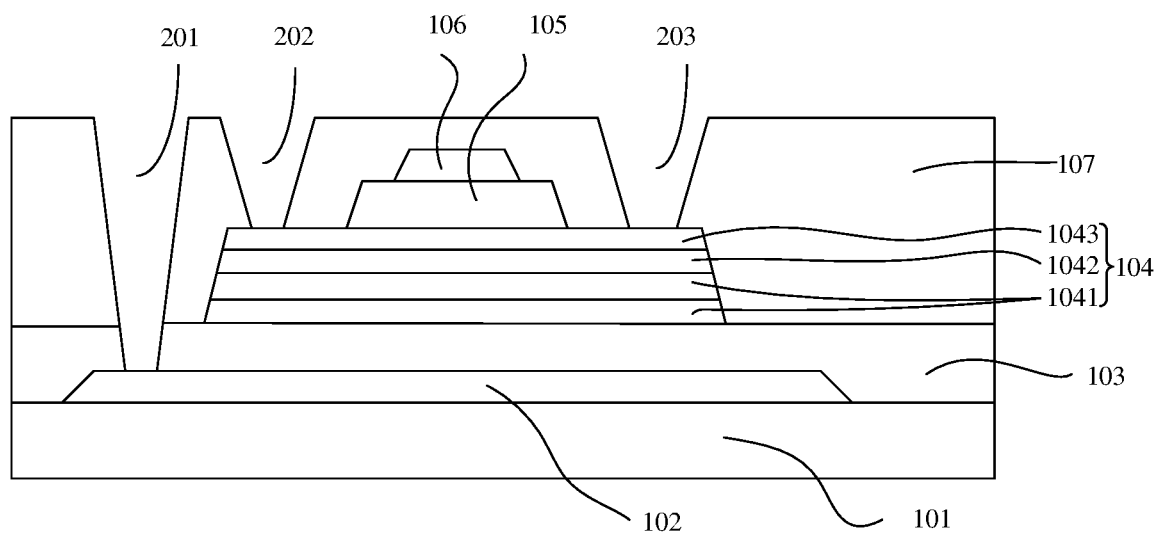
FIG. 8 is a schematic diagram of manufacturing an interlayer dielectric layer and a plurality of via hole of one embodiment of the present disclosure.

As shown in FIG. 8, the interlayer dielectric layer 107 is deposited on the buffer layer 103 by using a chemical vapor deposition method, and the interlayer dielectric layer 107 and the buffer layer 103 are dug using a photolithography process to obtain the first via hole 201, the second via hole 202, and the third via hole 203, wherein, an oxidizing gas such as fluorine (F) can be used as an etchant in the photolithography process.

It should be noted that the first via hole 201 is disposed on the interlayer dielectric layer 107 and the buffer layer 103, the second via hole 202 and the third via hole 203 are disposed on the interlayer dielectric layer 107.

Figure 9:
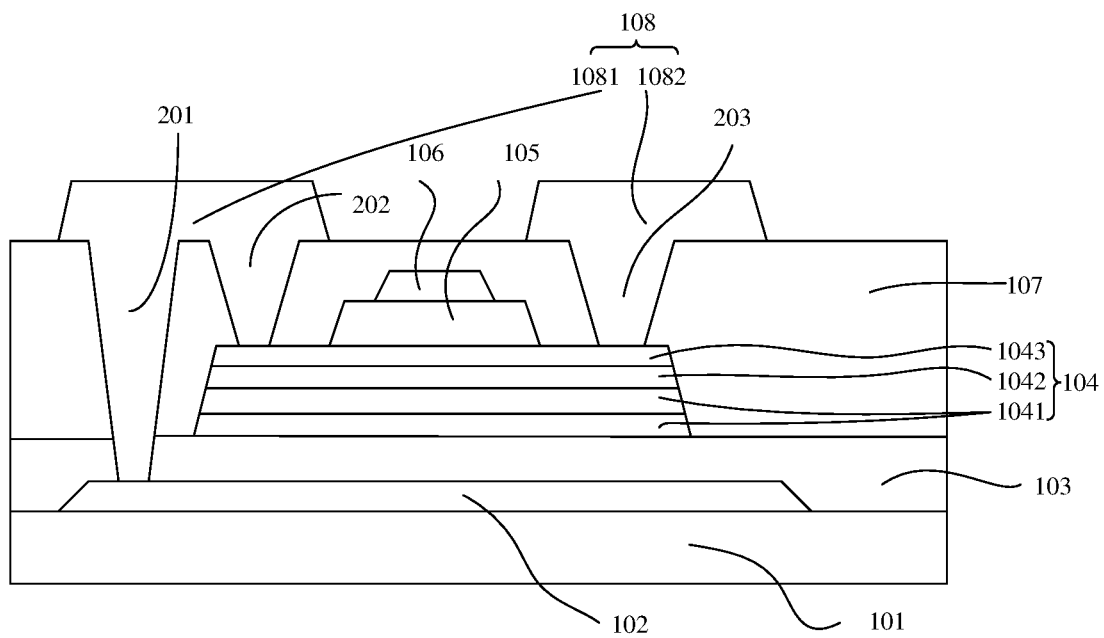
FIG. 9 is a schematic diagram of manufacturing a source-drain layer of one embodiment of the present disclosure.

As shown in FIG. 9, a physical vapor deposition method is used to deposit metal on the interlayer dielectric layer 107, and a photolithography process is used to etch the metal to form the source electrode 1081 and the drain electrode 1082. At this time, the source electrode 1081 and the drain electrode 1082 are collectively referred to as the source-drain layer 108, wherein the material of the metal may be molybdenum (Mo), copper (Cu), or an alloy material composed of molybdenum and copper, and a hydrogen peroxide ($H_2O_2$) chemical solution may be used as an etchant in the photolithography process. At this time, the source electrode 1081 is electrically connected to the light-shielding layer 102 through the first via hole 201, the source electrode 1081 is electrically connected to the active layer 104 through the second via hole 202, and the drain electrode 1082 is electrically connected to the active layer 104 through the third via hole 203.

Figure 10:
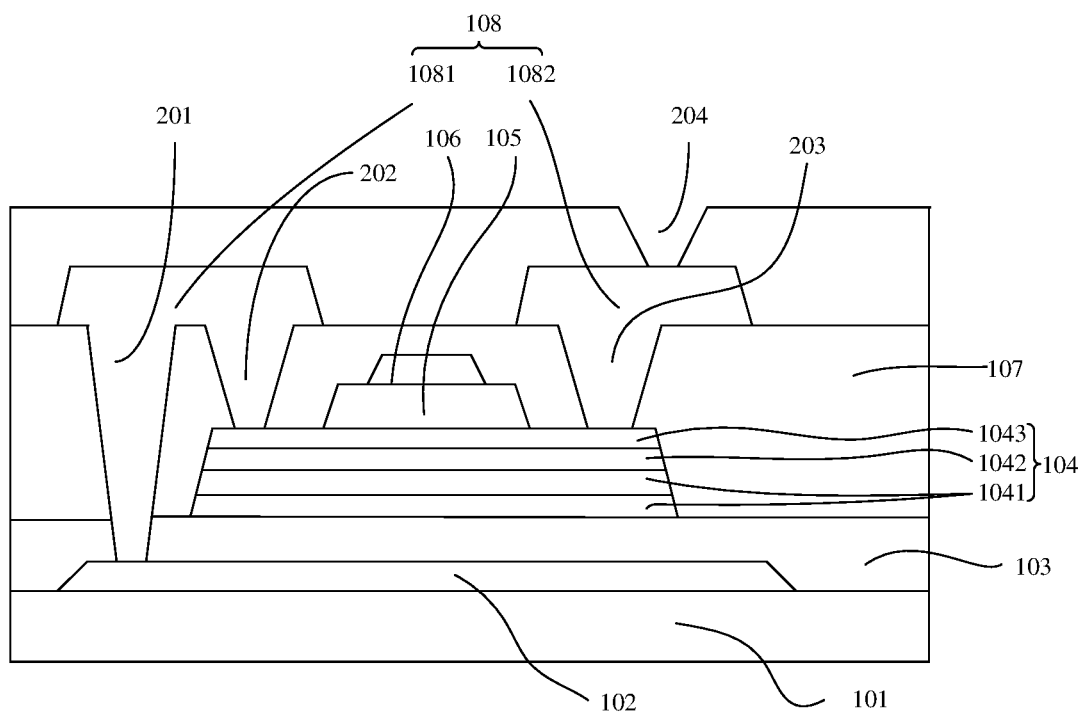
FIG. 10 is a schematic diagram of manufacturing a passivation layer of one embodiment of the present disclosure.

As shown in FIG. 10, a passivation layer 109 is deposited on the source-drain layer 108 by using a chemical vapor method, and the passivation layer 109 is dug by a photolithography process to obtain a fourth via hole 204. The material of the passivation layer 109 is a silicon oxide (SiOx) film, a silicon nitride (SiNx) film, or a composite film formed by alternately stacking silicon oxide films and silicon nitride films. An oxidizing gas such as fluorine (F) can be used as an etchant in the photolithography process.

As shown in FIG. 1, indium tin oxide (ITO) is deposited on the passivation layer 109 by using a physical vapor method, and the indium tin oxide is etched by using a photolithography process to obtain the pixel electrode layer 110, wherein an oxalic acid-based chemical solution can be used as an etchant in the photolithography process.

Embodiments of the present disclosure also provide a display panel including the above-mentioned thin film transistor.

It should be noted that the structure of the thin film transistor has been described in detail in the above embodiments, and will not be repeated here. It can be understood that, since the performance of the thin film transistor can be greatly improved, therefore the performance of the display panel including the thin film transistor can be greatly improved.

It can be understood that, for those of ordinary skill in the art, equivalent replacements or changes can be made according to the technical solutions and inventive concepts of the present disclosure, and all such changes or replacements should fall within the protection scope of the appended claims of the present disclosure.

What is claimed is:

1. A method of manufacturing a thin film transistor, comprising:
   step S01, manufacturing a substrate;
   step S02, manufacturing a light-shielding layer on the substrate;
   step S03, manufacturing a buffer layer on the substrate, and the buffer layer covering the light-shielding layer;
   step S1, manufacturing an active layer comprising a plurality of stacked structures on the buffer layer by an atomic layer deposition method, comprising:
   step S11, using the buffer layer as a current layer;
   step S12, using the atomic layer deposition method, sequentially depositing N-layers of indium oxide on the current layer, depositing the gallium oxidation layer on the N-layers of indium oxide, and depositing the zinc oxidation layer on the gallium oxidation layer to form the stacked structure, wherein N is an integer greater than 1;
   step S13, using the zinc oxidation layer on the currently formed stacked structure as the current layer, and repeatedly performing the step S12 until several stacked structures are formed; and
   step S14, patterning the plurality of the stacked structures to obtain the active layer;
   wherein the deposition rates of the zinc oxidation layer, the gallium oxidation layer and the N-layers of indium oxide are sequentially reduced.

2. The method of manufacturing the thin film transistor as claimed in claim 1, wherein thicknesses of the indium oxidation layer, the gallium oxidation layer, and the zinc oxidation layer ranges from 50 A to 300 A.

3. The method of manufacturing the thin film transistor as claimed in claim 1, wherein deposition rates of the indium oxidation layer, the gallium oxidation layer, and the zinc oxidation layer ranges from 0.8 A/cycle to 2.2 A/cycle.

4. The method of manufacturing the thin film transistor as claimed in claim 1, wherein after the step S1 further comprises the following steps:
   s21, manufacturing a gate insulating layer on the active layer;
   s22, manufacturing a gate layer on the gate insulating layer;
   s23, manufacturing an interlayer dielectric layer on the buffer layer and covering the gate layer, the gate insulating layer, and the active layer;
   s24, manufacturing a source-drain layer on the interlayer dielectric layer, and the source-drain layer comprises at least one of source electrodes and a plurality of at least one of drain electrodes arranged at intervals;
   s25, manufacturing a passivation layer on the interlayer dielectric layer and covering source-drain layer; and
   s26, manufacturing a pixel electrode layer on the passivation layer.

5. The method of manufacturing the thin film transistor as claimed in claim 4, further comprising:
   manufacturing a first via hole on the interlayer dielectric layer and the buffer layer is configured to electrically connect the source electrode and the light-shielding layer;
   manufacturing a second via hole on the interlayer dielectric layer for electrically connecting the source electrode and the active layer;
   manufacturing a third via hole on the interlayer dielectric layer for electrically connecting the drain electrode and the active layer; and
   manufacturing a fourth via hole on the passivation layer and configured to electrically connect the drain electrode and the pixel electrode layer.

* * * * *